US006426540B1

(12) United States Patent
Sittig et al.

(10) Patent No.: US 6,426,540 B1
(45) Date of Patent: Jul. 30, 2002

(54) OPTIMIZED BORDER OF SEMICONDUCTOR COMPONENTS

(75) Inventors: Roland Sittig, Braunschweig; Detlef Nagel, Dresden; Ralf-Ulrich Dudde, Hohenaspe; Bernd Wagner, Looft; Klaus Reimer, Itzehoe, all of (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 09/555,040

(22) PCT Filed: Nov. 23, 1998

(86) PCT No.: PCT/DE98/03453

§ 371 (c)(1),
(2), (4) Date: Aug. 23, 2000

(87) PCT Pub. No.: WO99/27582

PCT Pub. Date: Jun. 3, 1999

(30) Foreign Application Priority Data

Nov. 24, 1997 (DE) .......................................... 197 52 020

(51) Int. Cl.⁷ .......................................... H01L 27/095
(52) U.S. Cl. .................. 257/471; 257/109; 257/149; 257/409; 257/472; 257/480; 257/481
(58) Field of Search ......................... 257/471, 47, 480, 257/481, 482, 483, 109, 149, 409

(56) References Cited

U.S. PATENT DOCUMENTS

| 3,706,128 A | * 12/1972 | Heer ............................. 29/578 |
| 4,633,292 A | 12/1986 | Fellinger et al. ............. 257/409 |
| 4,680,601 A | * 7/1987 | Mitlehner et al. ............. 357/15 |
| 4,764,249 A | 8/1988 | Gobrecht et al. ............ 257/630 |
| 5,914,500 A | * 6/1999 | Bakowski et al. ............. 257/77 |
| 6,064,103 A | 5/2000 | Pfirsch ........................ 257/488 |

FOREIGN PATENT DOCUMENTS

| DE | 19605633 A1 | * 12/1996 | |
| EP | 61181414 | 2/1988 | ........... H01L/29/06 |

OTHER PUBLICATIONS

0018–9383/92—Multistep Field Plates for High–Voltage Plannar p–n Junctions– IEEE Transactions on Electron Devices, Wolfgang Feiler, Elmar Falck, and Willie Gerlach, vol. 38, No. 6, Jun. 1992 (7 pages).
0038–1101(95) 00195–6—Theoretical Investigation of Planar Junction Termination, T. Drabe and R. Sittig—Solid–State Electronics vol. 39. No. 3, pp. 323–328, 1996.
XP–002102107—Tapered Sidewall Schottky Diodes with Very Low Taper Angles, Japanese Journal of Applied Physics, vol. 22 (1983) Supplement 22–1, pp. 137–140.
XP–002102106—The Contour of an Optimal Field Plate— An Analytical Approach, K.P. Brieger, Elmar Falck, and Willi Gerlach; IEEE Transactions on Electron Devices, vol. 35, No. 5, May 1988.

* cited by examiner

Primary Examiner—Nathan Flynn
Assistant Examiner—Remmon R. Fordé
(74) Attorney, Agent, or Firm—Duane Morris, LLP (57) ABSTRACT

The invention relates to a semiconductor component which is capable of blocking such as an (IGBT), a thyristor, a GTO or diodes, especially schottky diodes. An insulator profile section (10a, 10b, 10c, 10d, 11) provided in the border area of an anode metallic coating (1, 31) is fixed (directly in the edge area) on the substrate (9) of the component. The insulator profile has a curved area (KB) and a base area (SB), said curved area having a surface (OF) which begins flat and curves outward and upward in a steadily increasing manner. A metallic coating MET1; 30a, 30b, 30c, 30d, 31b) is deposited on the surface (OF). Said coating directly follows the surface curvature and laterally extends the inner anode metallic coating. The upper end of the curved metallic coating (MET1; 30a, 30b . . . ) is distanced and insulated from one of these surrounding outer metallic coatings (MET2; 3) by the surrounding base area (SB) of the insulator profile (10a, . . . , 11) such that an extensively constant course of the line of force which evades extreme values results between both metallic coatings (1, 31, MET1; 3, MET2) when reverse voltage or blocking voltage is applied between the interspaced metallic coatings.

14 Claims, 4 Drawing Sheets

OPTIMIZED BORDER OF SEMICONDUCTOR COMPONENTS

In semiconductor components having at least one blocking p-n junction, the latter appears on the surface of the substrate, on which and in which the semiconductor component is realized, somewhere between the live contacts. In said surfacing areas high electric field strengths, in case the p-n junction is blocking, i.e. a higher voltage is applied to the cathode than to the anode or a controllable semiconductor device is not yet connected through its gate terminal, result in undesired leaking currents flowing between the anode and the cathode, which currents are designated as positive or negative reverse bias current depending on the direction of polarization of the voltage to be blocked or reversed. For reducing that portion of the reverse bias currents, which is caused by high field strengths in the termination portion, so-called "junction terminations" are employed in the prior art, which, for example in the form of specially formed field plates, cause an optimized course of equipotential lines and thus avoid high field strengths in the termination portion of such components, cf. DE-A 195 35 332 (Siemens), column 3, line 58 to column 4, line 35; or "Multistep Field Plates . . .", IEEE Transactions on electron. devices, Vol. 39, No. 6, June 1992, from page 1514 onwards; "The Contour of an Optimal Field Plate", IEEE Transactions on electron. devices, Vol. 35, No. 5, May 1988, from page 684 onwards; and finally "Theoretical Investigation of Planar Junction Termination", Solid-State Electronics, Vol. 39, No. 3, pages 323 to 328, 1996. The planar junction terminations described therein are optimized with regard to their geometry, on the one hand as a field plate having steps and on the other hand as an optimized steadily curved field plate having a modified elliptical geometry. However, the prior art has not yet succeeded in economically fabricating the optimized geometric structure of a field plate in the termination portion of a semiconductor component capable of blocking, especially of such a component to which a high voltage of more than 500 V can be applied.

It is the object of the invention to fabricate the aforementioned semiconductor components, which are in particular highly blocking or capable of blocking, on an economic basis, i.e. at low costs, and nevertheless utilize their maximum blocking capacity.

This is achieved by the invention, if a termination portion of the inner anode metallic coating comprises an insulator profile, having a shape which begins flat and is curved outwards and upwards in a steadily increasing manner, which portion is the "curved portion" of the insulator profile, and having a "base portion", which is located directly adjacent thereto and is virtually planar, said base portion together with the curved portion determining the cross-section of the insulator profile.

The insulator profile is designed such that, between the curved inner metallic coating, outwardly extending the anode, and the outer metallic coating, located outwards of and adjacent to the base portion of the insulator profile, which will in most cases be the cathode, peak values of an electric field generated during operation can be avoided. The insulator profile is produced by a method, in which an at first deposited insulator layer having a thickness is additionally covered with a resist layer over the entire substrate, which resist layer is illuminated through a mask in a structured manner, which mask changes in its gray-tone value in accordance with the desired course of curvature in the curved portion of the respective insulator profile. The gray-tone value in the mask is transferred into the resist layer by exposure, which layer can be structured subsequent thereto, especially by developing, in order to then transfer the structure of the developed resist layer into the insulator layer having a thickness by an etching process, such as RIE (reactive ion etching), wherein it is an advantage if the etching rate of the insulator layer and the etching rate of the resist remainders, remaining after developing the exposed resist layer, are about equal in order to prevent a not-to-shape transfer of the resist profile into the insulator.

The resulting insulator profiles can either surround the anode in the form of a wall or a plurality of insulator profiles may be provided which are arranged in an outwards staggered manner and the curved surface of which is differently shaped. If a plurality of staggered insulator profiles is provided (claim 2, claim 3), the curvature of the surfaces of the curved portions is not equal, but steadily increases with each profile being located further outwards (claim 3).

On the mentioned respective curved surfaces metallic coatings are deposited, which, for the insulator profile outwardly adjoining the inner anode, conductingly pass over into the anode metallic coating.

The structuring, which is coded in its gray-tone value, is performed, during exposure, such that a desired light-intensity profile is coded into the mask by the semitone process, i.e. via a pixel screen, and that the pixel sizes are transferred below the resolving limit of a reducing projection exposure in an almost continuous course of exposure of the resist layer, by which it is thus possible to produce continuous surfaces curving outwards and upwards; the insulator profiles formed according to the invention thus have at least one continuous surface (without steps) steadily extending across a substantial area, which surface is designed in a manner which theoretical calculations for an optimized course of flux lines, when a reverse bias voltage load or conducting-state blocking load is applied, imply to be favorable.

By use of the invention the thickness of the insulator layer can be continuously varied in a process in a predetermined and controlled manner over a wide area of up to 10 $\mu$m; it is not necessarily required to give the surface curvature an ideal course as long as it is ensured that the substantial increases of field strength can be avoided and that the reverse bias voltage load at the termination of the anode towards the cathode does not include substantial peak values.

Even with semiconductor components having reverse bias voltages of more than approx. 500 V, the theoretically maximally possible reverse bias voltage can almost be achieved at minimum space requirements for the junction termination, i.e. the "blocking capacity" of the occupied space can be fully utilized. The minimum space requirements are important in said components, a plurality of which is produced from one wafer, and wherein utilizing the blocking capacity to a maximally possible extent becomes the more important the higher the reverse bias voltages are. Said aspects are of particularly great importance for highly blocking IGBTs.

Even with Schottky diodes, which are not based on a p-n junction, but which utilize the blocking capacity of a metal-semiconductor junction, the insulator profiles produced according to the invention may be employed in an advantageous manner. At the edge of the metal-semiconductor junction the small effective radii of curvature would result in excessive field increases. For preventing said increases, diffused guard rings are employed in the prior which, however, at strong conducting-state loads, cause an undesired injection of minority charge carriers. By use of the insulator profiles and field plates produced according to the invention such an injection of charge carriers does not occur and the diffusion process during production can be omitted.

The use of the invention, which is limited to measures performed at the surface of the semiconductors, is particularly advantageous even if the power semiconductors are to be improved on the basis of silicon carbide (SiC), as an example for a semiconductor having a high band width (claim 12). In said semiconductors a very low diffusion constant for doting substances must be put up with and this being the reason why termination portions can virtually not be produced by diffusion.

The component, with the insulator profiles produced according to the invention, comprises profiles which, at the transition to the anode, do not terminate in a continuous or steady manner, but terminate with a small step in the order of magnitude of more than 5 nm and less than 50 nm. Said step being very small compared to the thickness of the metallic coating and is virtually of no consequence, but results from the method of production by gray-tone lithography. Thus, the metallic coating may, for example, have a thickness of approx. 1 µm, while the "step" of the insulator at the end of the curved portion of the insulator 20 produced by gray-tone lithography is 20 nm.

Gray-tone lithography works in such a manner that the substrate is covered with an insulator layer, which is at first covered with a photosensitive layer, which is exposed in such a manner that the course of curvature of the surface of the insulator profile is exposed into the photoresist layer by gray-tone variation, i.e. by adapting the light-intensity distribution to the shape of the insulator profile, which photoresist layer is structured subsequent thereto by developing (claim 11). The photoresist layer structured in such a manner now consists of resist remainders only, forming blocks on the insulator layer, which blocks correspond to the insulator profiles. By means of an etching technique, for example a dry-etching process, the resist remainder still present on the substrate surface is conformally etched into the insulator layer, wherein the insulator layer is substantially planely removed and is more extensively removed where there are no resist remainders (claim 6).

The transfer by shape is promoted if the etching rates of the resist remainders and the insulator layer are equal; if they are not equal the shape of the resist remainder must be adapted accordingly, which may be effected by adapting the intensity distribution during exposure.

The height of the insulator profile in the base portion can be selected to be higher or lower (claim 4, claim 5). If the insulator profile has a height of more than approx. 5 µm in the base portion, the slope at the end of the curved portion at the transition to the base portion is more than 10°. The curved portion ends steeper here than in the insulator profile, which is flat in the base portion (claim 5). In a higher base portion the normal extension of the base portion is substantially ten times the height of the base portion, preferably even more.

If a more flat base profile, which is easier to fabricate by gray-tone lithography, is selected (claim 5), an additional screen electrode, which is located above the anode potential of the inner metallic coating, can be formed above the junction termination. The lateral extension of the base portion is a multiple of the height of the base portion here, in particular more than 50 times to 200 times the height of the base portion, which especially has a height of 2 µm. Between the end of the curved portion and the beginning of the upward curvature of the additional screen electrode (hood) there is an intermediate region, which, in its extension, is adapted substantially to the radius of curvature of the curved lateral outer end of the hood, in which intermediate region the distance between the hood, which follows a substantially horizontal path here, and the surface of the base portion is substantially constant.

The curved portion of the hood is preferably a quarter circle (claim 7). Its curvature can be considerably more pronounced than that of the surface of the curved portion within the base portion of the insulator profile.

The region between the anode metallic coating and the outer cathode metallic coating, i.e. the region of one or more staggered insulator profiles, can be covered in an elevated manner with a wall-like casting compound, in order to prevent flashover (claim 9).

If insulator profiles arranged in an outwards staggered manner are provided (claims 2, 3), below each of the staggered metallic coatings, extending beginning from the outer end of the base portion of the insulator profile located further inwards up to the upper end of the curved portion of the base profile located further outwards, a strip-shaped compensating area can be provided in the substrate, which is diffused into the substrate and which transfers the potential present at the respective location when a voltage is applied from the substrate area to the respective metallic coating (claim 10). The doting of said strip-shaped zones diffused into the substrate substantially corresponds to the doting which is selected for a p+ region below the anode metallic coating.

The penetration depth of the diffused zones below the metallic coating is preferably only low, preferably less than 10 µm, which technologically does not give rise to field peaks. The p+ diffusion zones transfer their potential to the respective metallic coating curving outwards and upwards (away from the substrate).

The lateral extension of the metallic curved portions should be adjusted to the space-charge depth and at the same time correspond to twice to three times the space-charge depth.

The invention(s) are described and completed in the following by means of a number of embodiments.

In FIG. 4 the flat insulator profile is supplemented by a metallic screen 32, which, starting from the anode metallic coating 31, is formed in the manner of a hood and is curved 32a laterally outwards and upwards adjacent to the curvature of the metallic coating having an ellipse-like form. A casting compound 41 insulates the region between anode, metallic hood 32 and cathode 3, outwards of the end of the insulator profile, which here has lateral dimensions of approx. 50 times to 200 times the height of the profile 11 in the base portion.

Figure 1:
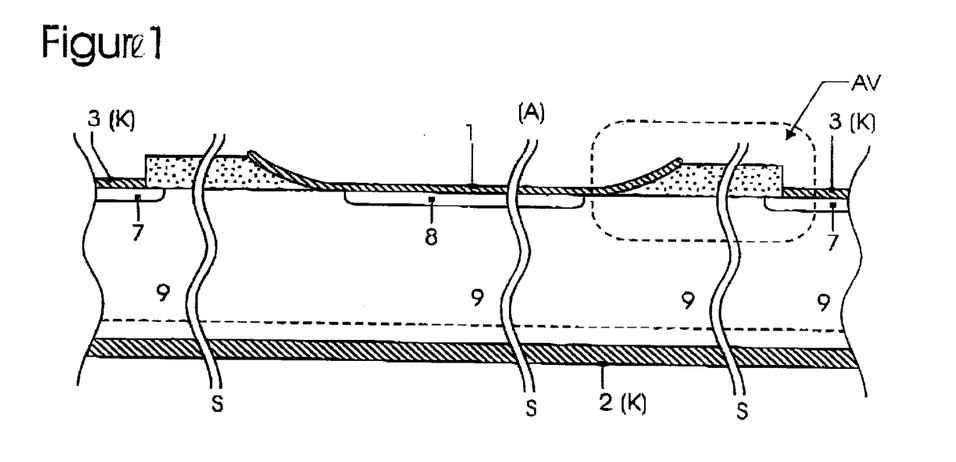
FIG. 1 shows, in section, a cutout of an active part of a semiconductor component capable of blocking, here a diode having an anode 1 and a cathode 2, 3 as well as a termination portion of the anode, which, by a planar junction termination, here a field plate, is formed such as is shown in FIGS. 3, which each show enlargements of the region AV.

The semiconductor component capable of blocking of FIG. 1 is provided with intersection regions S so that only cutouts of the actual lateral extension of this semiconductor component can be seen herein. Two essential regions are the anode region 1 and the junction termination, being provided with an insulator profile here, which will be described in more detail with respect to FIGS. 3a and 3b. The relevant cutout AV is illustrated in more detail and to a larger scale therein.

Below the anode 1, which is formed by a metallic coating, there is a p+ region of high doting concentration, which is to be considered virtually as a metallic region. In the termination portion the metallic coating 1 changes in form of an upwards curved field plate, which curvature is determined by the profile shape of the insulator in the cutout region AV. Outwards of the insulator profile the cathode 3 is provided as well as on the opposite side of a substrate 9, which forms the semiconductor component. Below the outer metallic coating 3 there is a channel stop 7, which is formed as an n+ region of high concentration diffused into the substrate. The cutout AV of FIG. 1 is shown enlarged in FIGS. 3a and 3b.

Figure 3A:
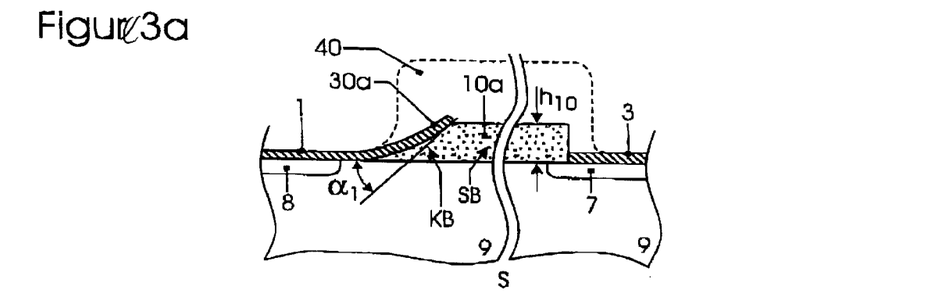
FIG. 3a is a section through a finished junction termination, produced after completion of the reactive ion etching 60 according to FIG. 2a and which, by a metallic coating 30a, extends the anode metallic coating 1 in the curved portion KB of the insulator profile 10a. The insulator profile 10a has a width corresponding to approx. 10 times to 15 times the height $h_{10}$. For example, a selected height of 10 µm results in a lateral extension of the profile of 100 µm, which is, however, highly dependent on the desired reverse bias voltage.

In FIG. 3a the termination portion of the anode 1 with the p+ region 8 arranged underneath is an upwards curved metallic coating 30a. It is covered by a wall-like casting compound 40 extending above the insulator profile 10a and reaching as far as the outer metallic coating 3 above the channel stop 7. Also in this case the junction termination is arranged on the substrate 9.

The insulator profile 10a is to be divided, for reasons of illustration, into a curved portion KB and a base portion SB, wherein the curved portion KB is located below the outwards and upwards curved metallic coating 30a as a continuation of the anode metallic coating 1 and the base portion SB is located outwards of the outer end of said extended curved metallic coating 30a having a substantially constant height $h_{10}$.

Figure 3B:
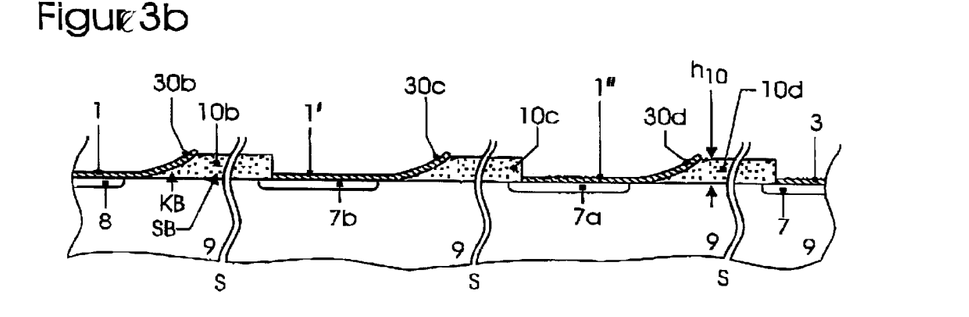
FIG. 3b is a result of the completed method of production for the staggered insulator profiles, which were begun to be transferred into the insulator layer 10 in FIG. 2b. For example, three outwards staggered insulator profiles 10b, 10c, 10d are produced, the curvatures of which are steeper towards the outside. Also in this case the figure is only a schematic illustration, wherein the intersection lines "S" remove a large region of unchanged shape.

In FIG. 3b a number of the shapes shown in FIG. 3a are arranged in a staggered manner. Herein the insulator profile is lower in the base portion SB than in FIG. 3a. In the illustrated example, three base profiles 10b, 10c, 10d connected outwards and in series are provided instead, all of which substantially following the structure of the base shape of FIG. 3a, except for the height $h_{10}$. The curved portions KB of each of the insulator profiles 10b, 10c, 10d, each being located internal of and adjacent to the respective base portion SB, are each more curved from the inside towards the outside for each individual base. This results in surfaces of the curved portion, on which the respective metallic coating 30b, 30c, 30d is arranged, and in an outwards staggered respectively changing profile, each profile starting approx. horizontally and extending along the curved portion in an outwards and upwards inclined manner. The respective angle of the end portion of the curved metallic coating is larger in the second metallic coating 30c than in the first metallic coating 30b and is larger in the third metallic coating 30d than in the second metallic coating 30c.

Starting from the inner anode 1, the first curved metallic coating 30b is located directly adjacent thereto. Outwards of the first insulator profile 10b, located below it, is the second curved metallic coating 30c, which includes a horizontal region 1', below which a p+ zone 7b is diffused into the substrate. Said zone will transfer the potential present at the component at the respective location when a voltage is applied from the substrate area 9 to the metallic coating 1' so that outwards staggered potentials will be defined, which are suspected by the metallic coatings and result in a field strength march in the curved portion, which largely avoids peak values. Accordingly, also the horizontal orientation of the metallic coating 1" located further outwards is provided horizontally above a further p+ zone 7a, being diffused into the substrate and extending towards the curved portion 30d, which has already been explained. Outwards of the outermost insulator profile 10d the cathode metallic coating 3 is provided including a channel stop 7, as illustrated in FIG. 3a. The respective intersection regions S cut out those regions, which have a far lateral extension and in which no change of shape is provided.

The zones 8, 7b, 7a, which are diffused into the substrate below the metallic coatings of FIGS. 3a and 3b, have a low penetration depth of less than 10 µm only, preferably 3 to 6 µm.

The semiconductor according to FIG. 3b is very cost-effective with regard to production since the insulator profiles have a low height $h_{10}$ only in the base portion SB. The height $h_{10}$ will be less than 5 µm, preferably in the order of magnitude of 2 µm.

During operation, when a reverse bias voltage or blocking voltage is applied, the described three staggered metallic coatings, from the anode 1 over the first stage 1' including the curved portion 30c and over the second stage 1" including the curved portion 30d, have different potentials, which are transferred by the potential-transmitting zones 7b, 7a to the metallic coatings. The extensions of the potential-transmitting zones 7a, 7b, which are diffused into the substrate to a low depth, from the crystalline region of the substrate 9 are chosen such that each of them begins internal of and below the outer end portion of the base portion of the insulator profile and extends outwards up to approx. that region, in which the insulator profile located further outwards with its curved portion KB begins to emerge or increase in height.

The production of the geometries according to FIGS. 3a and 3b will be explained with reference to FIGS. 2a and 2b.

Figure 2A:
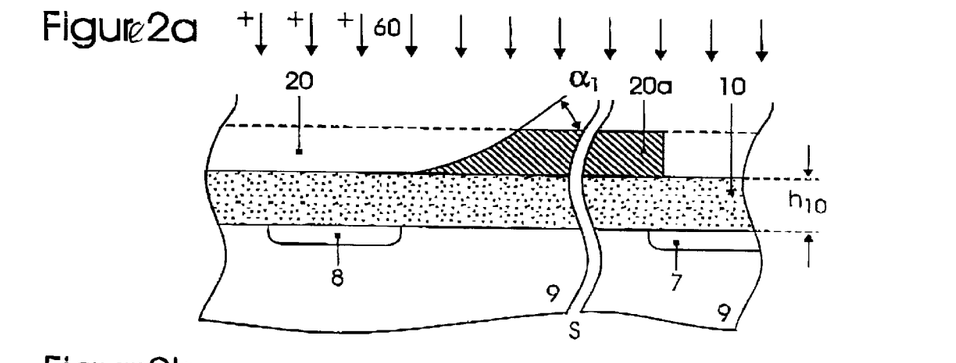
FIG. 2a is an illustration of the structuring of a photoresist layer 20, which is at first present over the entire surface and which, after structuring (by exposure), is conformally transferred into the insulator 10 having the illustrated shape 20a, by the shown dry etching process 60, here a reactive ion etching (RIE) process.

FIG. 2a shows the substrate 9 having an insulator layer 10 formed thereon, usually made of silicon oxide. In FIG. 2a the starting point is illustrated, at which a shape 20a of a resist profile or resist remainder formed after structuring (by exposure) is conformally transferred from a photoresist layer 20, present over the entire surface (illustrated by dashed lines), into the insulator layer 10 located below it. As the etching process a dry etching process, here a reactive ion etching by ion radiation 60, is illustrated. Prior thereto an area 8 (p+ diffusion area), diffused into the substrate 9 below the anode to be formed, and a channel stop 7, diffused in to the substrate and having an n+ diffusion area (outwards of the resist profile to be formed), are provided. On the thus prepared substrate 9 an insulator 10 is uniformly applied, substantially having the height, which a future resist profile is to have in the base portion SB of FIG. 3a. An additional resist layer 20 is deposited on the insulator profile, which layer is at first illuminated through a mask in a structured manner, which mask changes in its gray-tone value in accordance with the respective course of curvature in the curved portion KB of the insulator profile. The gray-tone value present in the mask (not shown) is transferred by exposure into the resist layer 20, which is structured subsequent thereto (especially by developing) in order to then transfer, by means of the etching process illustrated in FIG. 2a, the resist remainders remaining after exposure and development into the insulator layer 10, wherein, figuratively speaking, the surface of the resist layer 20 present so far is lowered onto the surface of the substrate, i.e. the remaining resist relief 20a, as the insulator profile, is (figuratively speaking) lowered into the insulator layer. The insulator 10 is removed in those regions where there are no resist blocks and is removed to a minor extent where the height of the resist remainder 20a is low, whereas in those regions where the resist remainder 20a is to form the base portion SB little to nothing is removed from the insulator height. Thus, after the conformal projection of the resist remainder 20 into the insulator layer 10, a shape of the insulator profile 10a having a curved portion KB and a base portion SB is produced, as is shown in FIG. 3a, however, yet without metallic coatings 1, 3. Said metallic coatings are applied subsequent thereto, possibly also the wall-like casting compound 40, in order to complete the junction termination.

For the conformal projection it is advantageous to substantially equalize the etching rate of the insulator layer 10 and the etching rate of the remaining resist remainders 20a so that no distortions will emerge during formation of the base profile, in particular in the curved portion KB. If a conformal projection is achieved, the angle of inclination $\alpha_1$ of the resist remainder 20a will be projected directly in the angle of inclination $\alpha_1$ in the slope at the upper end of the metallic coating 30a in FIG. 3a, or the surface OF of the curved portion KB will have said slope in the laterally outer end portion, respectively.

Figure 2B:
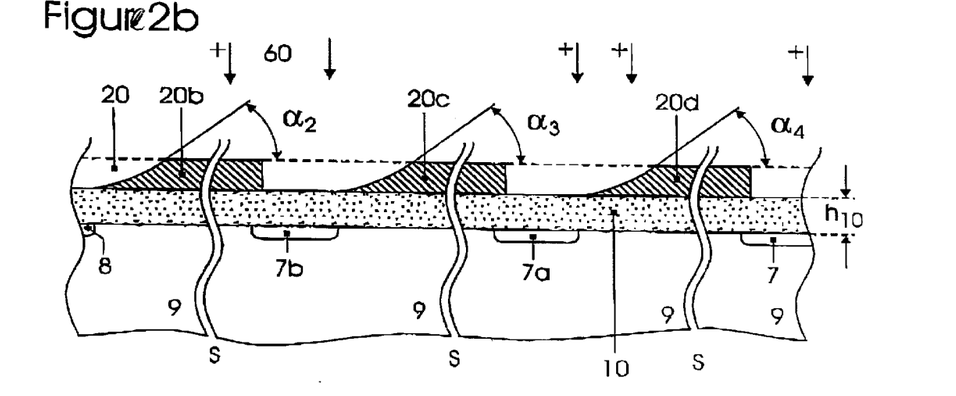
FIG. 2b is, corresponding to FIG. 2a, an illustration of staggered resist profiles 20b, 20c, 20d, which are arranged outwards in series on the insulator 10, wherein it is just begun, by reactive ion etching 60, to conformally transfer the resist remainders (resist profiles), already having the shape of desired insulator profiles, into the insulator layer 10.

The structure of FIG. 3b is produced in accordance with the method of production schematically illustrated in FIG. 2b in the same manner, which method is performed analogously to FIG. 2a. Herein, with the same number of process steps, a staggered arrangement of insulator profiles 10b, 10c, 10d was projected from respective resist remainders 20b, 20c, 20d in accordance with the resist remainder 20a of FIG. 2a.

Also in FIG. 2b, the starting point is the plane resist layer 20, which is illuminated in a structured manner and leaves behind resist remainders, which are conformally projected by means of a dry etching process 60 into the insulator 10, which is selected thinner here, the height of which $h_{10}$ being in an order of magnitude of less than 5 $\mu$m, especially 2 $\mu$m, for the staggered arrangement.

Prior to applying the insulator layer 10, as already explained with regard to FIG. 3b, the potential-transmitting zones or—for a circular design—rings 7a, 7b are diffused into an n⁻ substrate 9, wherein said zones are arranged in such a way such that they will be located below that region of the insulator 10, in which the plane resist layer 20 is virtually completely removed by developing.

The ratio of the slopes at the upper end of the respective curved portions of the resist remainders 20b, 20c, 20d can be expressed by $\alpha_4 > \alpha_3 > \alpha_2$, i.e. an increasing slope at the upper end of the curved portion for each resist remainder located further outwards, which passes over in a corresponding increasing slope of the upper end of the staggered curved portions KB of FIG. 3b.

Figure 5:
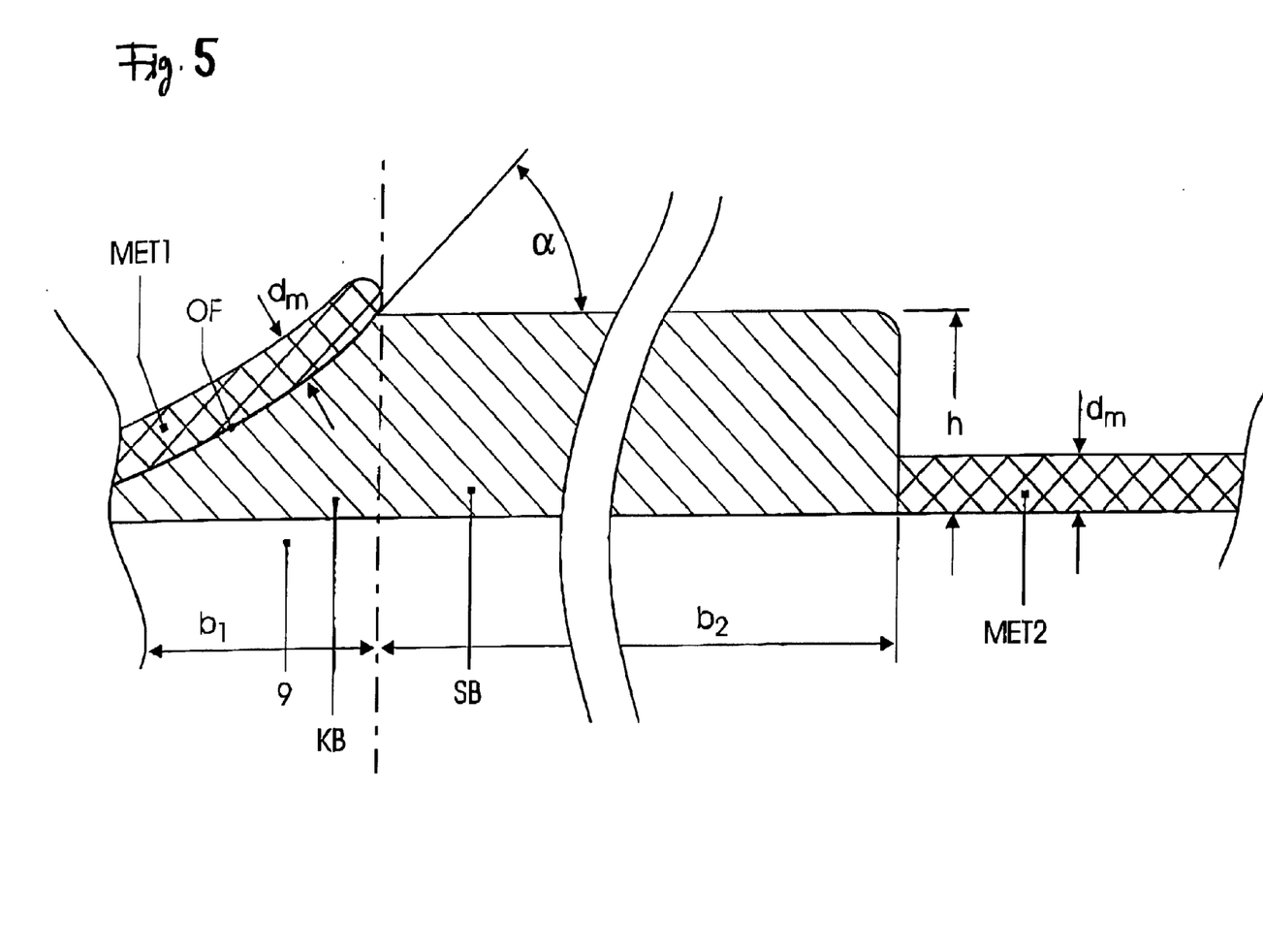
FIG. 5 schematically illustrates the structure of an insulator profile produced by gray-tone lithography including the curved portion KB and the extensively extending base portion SB, the latter having an about constant height "h", whereas the curved portion steadily decreases from said constant height towards the anode, where, preferably by a small step 11s, it reaches the level of the substrate 9. A metallic coating MET1 is deposited in the curved portion, which coating extends the anode metallic coating 1, 31 and permits a controlled course of flux lines between the anode and the external cathode MET2 free of high peak values.

For a better illustration of the upper end of the curved portion KB, i.e. the transition area between curved portion and base portion, an enlarged cutout of either FIG. 3a or the outer stage of the field plate 1" of FIG. 3b is illustrated in FIG. 5. FIG. 5 is divided into a left-hand curved portion KB having a lateral extension $b_1$ and a base portion SB having a lateral extension $b_2$. The substrate 9 is arranged below the insulator profile (consisting of curved portion and base portion). Right-hand of the base portion begins the outer metallic coating MET2 having a thickness $d_m$, left-hand of the base portion at the upper end of the curved portion KB begins the inwards curved inner metallic coating MET1, which is applied to a correspondingly curved surface OF and having a thickness $d_m$. The angle of inclination a at the upper end of the curved portion is illustrated. It corresponds to angle $\alpha_4$ or $\alpha_1$, respectively, with regard to the examples shown in FIGS. 3a or 3b. Height h of the base portion SB corresponds to height $h_{10}$ of FIGS. 3a, 3b.

Figure 4:
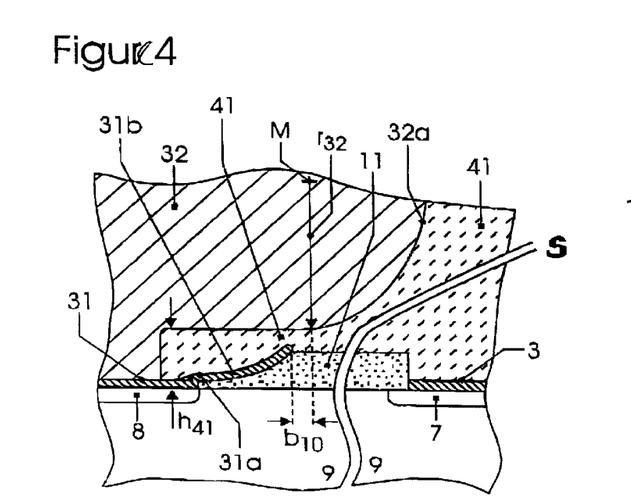
FIG. 4 and FIG. 4a are illustrations of a more flat insulator profile 11, which, at the inner end towards the anode 31, has a small step 11s having a height "d", which is shown more clearly in the enlarged illustration of FIG. 4a. Said step has a height of less than 50 nm, which height is preferably in an order of magnitude of between 20 nm and 30 nm, with a metallic coating 31, 31a, 31b covering it having a thickness of approx. 1 µm.
Figure 4A:
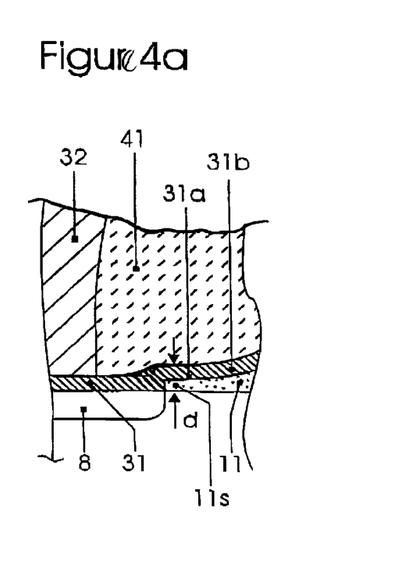
Figure 6:
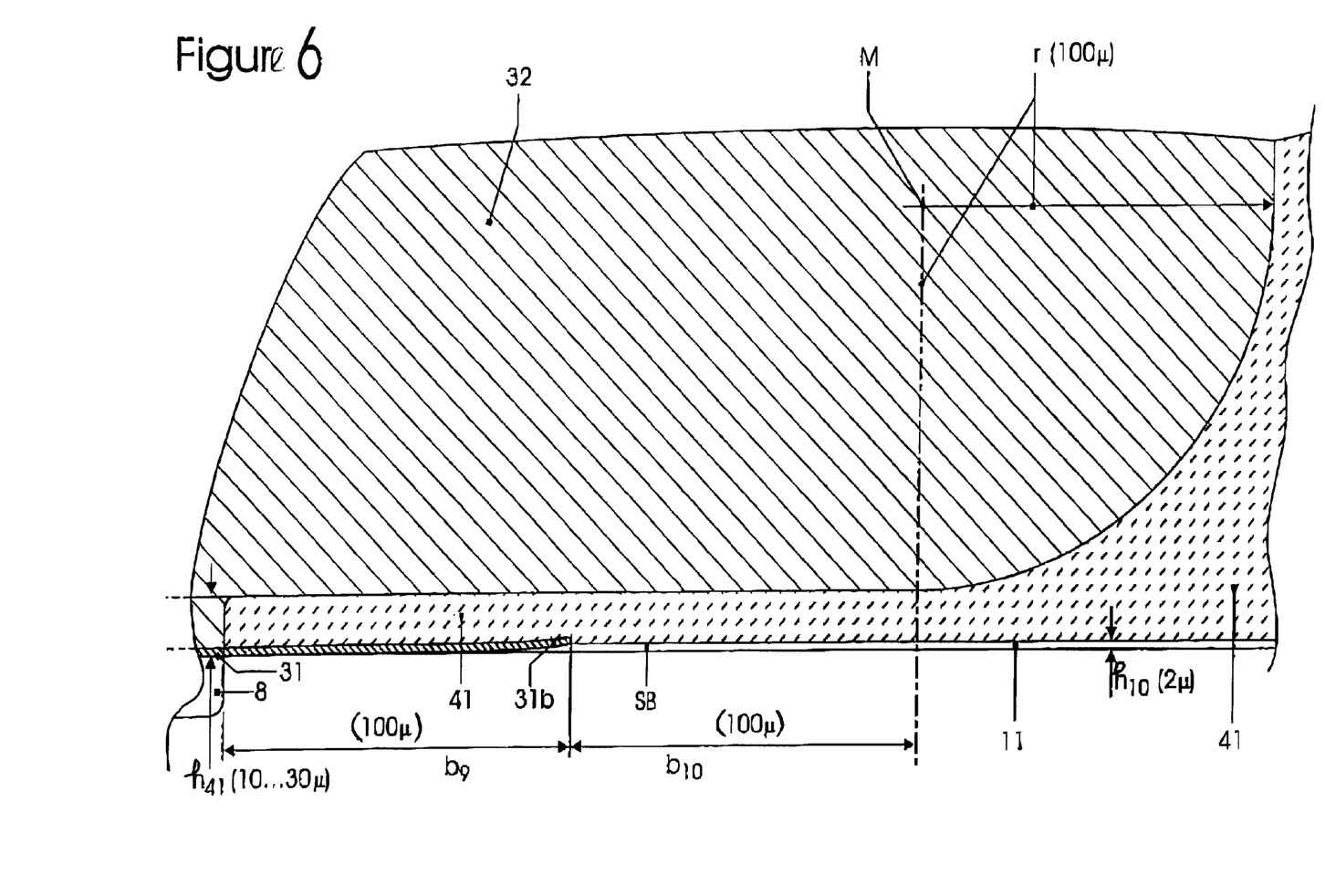
FIG. 6 is an approx. true to scale illustration of the arrangement of FIG. 4 with the insulator profile having a flat base portion SB.

FIG. 4 together with its enlarged cutout shown in FIG. 4a shows an insulator profile 11, which may be formed in accordance with the flat insulator profile of FIG. 3b, which is, however, not comprised of a plurality of staggered arrangements, but comprises a hood 32 extending above the insulator profile, which hood serves as a screen and includes an outer curved portion 32a. It is connected to the anode 31 (above the p+ diffusion area 8) in a voltaically conducting manner and runs at first upwards and then laterally outwards with a constant height $h_{41}$. The region between the lower area of the hood 32 and the insulator profile as well as the metallic coating 31, 31a, 31b is filled with a casting compound 41, which has an insulating effect. FIG. 4 is not true to scale, it serves instead to describe the structural elements. An exemplary, approx. true to scale embodiment of the arrangement according to FIG. 4 is shown in FIG. 6.

It is the purpose of FIG. 4 and the enlarged cutout shown in FIG. 4a to describe a detail of the inner end of the curved portion KB of the insulator profile 11. Said inner end, which substantially begins at the outer end of the p+ diffusion zone 8, is provided in the form of a step 11s, which is formed in an order of magnitude of 20 nm to 30 nm; it may, however, also deviate from said values, but usually has a height of 50 nm, which height is designated "d". Said step is produced by the method of production according to FIGS. 2a, 2b and results from the graduation of the gray-tone value of the mask during exposure. The gray-tone value cannot decrease in an infinitely fine manner to zero (permeable mask) so that from a minimum gray-tone value onwards no further graduation is effected and step 11s is at first produced in the resist remainder 20a or 20b, respectively, during exposure and is then transferred into the insulator 10 by dry etching 60. In the region of step 11s, also the course of the metallic coating 31 towards the continuously curved portion 31b, which is free of steps, includes a slight prominence 31a, which, however, with a metallization thickness of usually 1 μm, is hardly noticeable compared to the preferred step height "d" being within a range of 50 nm and does not cause peak values in the course of flux lines.

A second detail is only schematically visible in FIG. 4, it is the radius of curvature $r=r_{32}$ preferably selected here shown as a quarter circle in the curved portion 32a of the hood 32. It begins at the distance $b_{10}$ from the upper end of the curved metallic coating 31b, which distance is considerably larger than illustrated in FIG. 4 and which is shown true to scale in FIG. 6 according to a specific example. In this example, said distance substantially corresponds to the radius of curvature r within the quarter circle 32a of the hood 32 above the base portion SB of the insulator 10.

Herein the insulator 10, according to FIG. 3b, has a flat height $h_{10}$, which is less than 5 μm and is preferably 2 μm. The radius r, illustrated as $r_{32}$ in FIG. 4, has dimensions of for example 100 μm and the distance $b_{10}$, according to FIG. 4, is likewise dimensioned.

In the example according to FIG. 6, in addition to this also the lateral extension of the curved portion KB of the insulator profile 11 is suitably provided with a width $b_9$, which substantially corresponds to the width $b_{10}$. The distance between the bottom surface of the hood 32 and the curved field plate 31b in the curved portion and the base portion 10, according to the example, is between 10 μm and 30 μm, represented by $h_{41}$, as shown in FIG. 4. Said region, as well as the curved portion and the region located laterally further outwards, is filled with a casting compound 41. It has an insulating effect and forms a mechanical stabilization.

A semiconductor component capable of blocking is an IGBT, a thyristor, a GTO or a diode, especially a Schottky diode. An insulator profile (10a, 10b, 10c, 10d, 11) is provided in the termination portion of an anode metallic coating (1, 31) and is fixed (directly) on the substrate (9) of the component and having a curved portion (KB) and a base portion (SB), said insulator profile comprising a surface (OF) in the curved portion (KB), which begins flat and is curved outwards and upwards in a steadily increasing manner. A metallic coating (MET1; 30a, 30b, 30c, 30d, 31b) is deposited on the surface (OF), which coating directly follows the surface curvature and laterally extends the inner anode metallic coating. The end of the metallic coating (MET1; 30a, 30b . . . ) is spaced in an insulating manner by the surrounding base portion (SB) of the insulator profile (10a, 11) from an outer metallic coating (MET2;3) surrounding said base portion.

A largely constant course of flux lines avoiding peak values results between both metallic coatings (1, 31, MET1; 3, MET2), when one of a reverse bias voltage and blocking voltage is applied between the spaced metallic coatings.

We claim:

1. Semiconductor component capable of blocking, such as an IGBT, a thyristor, a GTO or a diode, especially a Schottky diode, wherein (a) an insulator profile is provided in a termination portion of an anode metallic coating and is fixed (directly in the termination portion) on a substrate of the component and having a curved portion and a base portion, said insulator profile comprising a surface in the curved portion, which begins flat and is curved outwards and upwards in a steadily increasing manner;

(b) a metallic coating is deposited on the surface, which coating directly follows the surface curvature and laterally extends the inner anode metallic coating;

(c) to space an upper end of the curved metallic coating in an insulating manner by the surrounding base portion of the insulator profile from an outer metallic coating surrounding said base portion such that a substantially constant course of flux lines avoiding peak values results between both metallic coatings, when one of reverse bias voltage and blocking voltage is applied between the spaced metallic coatings.

2. Component according to claim 1, wherein a plurality of insulator profiles, especially two or three insulator profiles, each having a curved portion and base portion, are arranged in a staggered manner around the inner anode metallic coating, said plurality of insulator profiles being all fixed on the substrate, wherein the curved metallic coating of the innermost insulator profile conductingly passes over into the anode metallic coating and the surrounding outer metallic coating of the outermost insulator profile is provided as a cathode metallic coating of the component.

3. Component according to claim 2, wherein the steady course of curvature of the curved metallic coatings is the steeper towards the outside, the further outward the associated insulator profile is located relative to the inner anode metallic coating.

4. Component according to claim 1, wherein only one insulator profile surrounds me anode metallic coating, said insulator profile having a height in the base portion, said height being more than 5μm, in particular substantially 10 μm, and the metallic coating in the upper portion of the curved portion of the insulator profile is noticeably inclined (more than 10°), in particular between 15° and 20°, relative to a surface of the substrate, and a lateral distance of an upper end of the curved portion from an inner end of the outer metallic coating is not less than, in particular substantially, ten times the height of the base portion of the insulator profile.

5. Component according to claim 1, wherein only one insulator profile surrounds the anode metallic coating, said insulator profile being flat in the base portion and having a height of less than 5 μm, in particular substantially 2 μm, and an upper portion of the metallic coating is slightly curved, especially inclined by a maximum of approx. 10° relative to the surface of the substrate, wherein a distance of said upper end of the only slightly curved metallic coating from an inner end of the outer metallic coating is more than ten times the height of the base portion, in particular more than fifty times to two-hundred times the height of the base portion, wherein the anode extends along a curved hood running particularly analogously to the curved portion in a continued manner in a distance $h_{41}$ above the insulator profile, and an insulating mass provided between the insulator profile and the hood.

6. Method for producing a termination portion of a semiconductor component, wherein an insulator profile including a curved surface, which is free of steps, is produced or may be produced by gray-tons lithography in the termination portion of an anode, wherein (a) a substrate is covered with an insulating layer having a thickness of in particular between 0.5 µm and 15 µm;

(b) said insulator layer having a thickness is covered with a photosensitive layer (photoresist layer);

(c) the photoresist layer is exposed through a mask, which changes in its gray-tone value in accordance with the course of curvature of the surface of at least one insulator profile, and is subsequently structured to form at least one resist remainder;

(d) the structured photoresist layer and the insulator layer are substantially planely removed by a dry-etching process, in order to transfer the at least one resist remainder—defined by the structuring—by shape into the insulator and to form at least one insulator profile around the anode.

7. Component according to claim 5, wherein the curvature of the hood, extending particularly as a quarter circle, is greater or more pronounced than the curvature of the laterally extended metallic coating.

8. Component according to claim 1, wherein a transition of the curved metallic coating to the anode metallic coating is provided through a small stop of the insulator profile at an inner end of the curved portion of the insulator profile, wherein said small step is in an order of magnitude of 5 nm to 30 nm so that the insulator profile does not terminate towards the anode metallic coating completely free of steps.

9. Component according to claim 1, wherein—after metallizing the curved surface of the insulator profile—a wall-like casting compound is deposited around the one or at least one of the plurality of insulator profiles, which casting compound insulatingly overlaps the metallic coatings on both ends of the insulator profile.

10. Component according to claim 2, wherein below each of the plurality of insulator profiles, which are arranged in an outwards staggered manner, a strip-shaped—ring-strip shaped for a circular anode—compensating area is diffused into the substrate as a zone in order to transfer the potential present at the component at the respective location when a voltage is applied from the substrate area to the respective metallic coating of the respective insulator profile, wherein the width of the strip is smaller than the width of the respective associated insulator profile and at least slightly overlaps the end of the insulator profile located further inwards.

11. Method according to claim 6, wherein the curved surface of the at least one insulator profile is metallized, wherein the structuring according to feature (c) is effected prior thereto by developing the exposed photoresist layer and is transferred into the insulator layer according to feature (d).

12. Component according to claim 1, comprising a substrate made of silicon carbide, which has a very low diffusion constant for doting substances.

13. Component according to claim 5, wherein an intermediate region $b_{10}$ is formed between the curved portion of the hood and the laterally extended, curved metallic coating, in which intermediate region the hood has a substantially constant distance from the base portion.

14. Component according to claim 5, wherein the base portion also extends below the curved hood portion.

* * * * *